United States Patent
Heubi (10) Patent No.: US 10,050,637 B2
(45) Date of Patent: *Aug. 14, 2018

(54) LOW-POWER CONVERSION BETWEEN ANALOG AND DIGITAL SIGNALS USING ADJUSTABLE FEEDBACK FILTER

(71) Applicant: SEMICONDUCTOR COMPONENTS INDUSTRIES, LLC, Phoenix, AZ (US)

(72) Inventor: Alexander Heubi, La Chaux-de-Fonds (CH)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/687,414

(22) Filed: Aug. 25, 2017

(65) Prior Publication Data

US 2017/0359078 A1    Dec. 14, 2017

Related U.S. Application Data

(63) Continuation of application No. 15/191,290, filed on Jun. 23, 2016, now Pat. No. 9,780,801.

(Continued)

(51) Int. Cl.
*H03M 1/06* (2006.01)
*H03M 1/08* (2006.01)
(Continued)

(52) U.S. Cl.
CPC .......... *H03M 1/08* (2013.01); *H03F 3/45475* (2013.01); *H03M 1/12* (2013.01);
(Continued)

(58) Field of Classification Search
CPC ................... H03M 1/00; H03M 1/12
(Continued)

(56) References Cited

U.S. PATENT DOCUMENTS 5,055,843 A   10/1991  Ferguson, Jr.
7,365,664 B2  4/2008   Caduff et al.
(Continued)

FOREIGN PATENT DOCUMENTS

EP    2490336 A1    8/2012
WO   2014094913 A1  6/2014

OTHER PUBLICATIONS

Lukas Dorrer et al., "A 3-mW 74-dB SNR 2-MHz Continuous-Time Delta-Sigma ADC With a Tracking ADC Quantizer in 0.13-urn CMOS," IEEE Journal of Solid-State Circuits, vol. 40, No. 12, Dec. 2005, pp. 2416-2427.

(Continued)

*Primary Examiner* — Joseph Lauture (57) ABSTRACT

A system to convert between analog and digital signals, in some embodiments, comprises: a differentiator to produce a differentiated signal based on an input signal and a feedback signal; an integrator, coupled to the differentiator, to integrate the differentiated signal; a quantizer, coupled to the integrator, to quantize the integrated signal; and a low-pass feedback filter, coupled between an output of the quantizer and an input of the differentiator, to generate said feedback signal using the quantized signal, wherein the low-pass feedback filter pushes at least some noise of the quantized signal downward in the frequency spectrum.

20 Claims, 5 Drawing Sheets

Related U.S. Application Data (60) Provisional application No. 62/219,532, filed on Sep. 16, 2015.

(51) Int. Cl.
  *H03M 1/12* (2006.01)
  *H03F 3/45* (2006.01)
  *H03M 1/00* (2006.01)
  *H03M 3/00* (2006.01)
  *H04R 3/02* (2006.01)

(52) U.S. Cl.
  CPC ........... *H03M 3/422* (2013.01); *H03M 3/464* (2013.01); *H03F 2200/03* (2013.01); *H03F 2200/264* (2013.01); *H03F 2203/45288* (2013.01); *H03M 1/00* (2013.01); *H03M 3/50* (2013.01); *H04R 3/02* (2013.01)

(58) Field of Classification Search
  USPC .................... 341/118, 119, 120, 155, 156
  See application file for complete search history.

(56) References Cited

U.S. PATENT DOCUMENTS 9,780,801 B2 * 10/2017 Heubi .................... H03M 1/08

| | | |
|---|---|---|
| 2002/0071578 A1 | 6/2002 | Van Der Zwan et al. |
| 2007/0188133 A1 | 8/2007 | Nakano et al. |
| 2011/0096878 A1 | 4/2011 | Mattisson |
| 2012/0139764 A1 | 6/2012 | Sosio et al. |

OTHER PUBLICATIONS

Omid Oliaei, "Sigma-Delta Modulator With Spectrally Shaped Feedback," IEEE Transactions on Circuits and Systems—II: Analog and Digital Signal Processing, vol. 50, No. 9, Sep. 2003, pp. 518-530.

Kathleen Philips et al., "A Continuous-Time ΣΔ ADC With Increased Immunity to Interferers," IEEE Journal of Solid-State Circuits, vol. 39, No. 12, Dec. 2004, pp. 2170-2178.

Mohamed O. Shaker et al., "A 6-Bit 130-MS/s Low-Power Tracking ADC in 90 nm CMOS," 2010 53rd IEEE International Midwest Symposium on Circuits and Systems, 978-1-4244-7773-9/10, 2010, pp. 304-307.

Tweksbury et al., "Oversampled, Linear Predictive and Noise-Shaping Codes of Order N>1 m" IEEE Trsanctions on Circuits and Systems, vol. CAS 25, No. 7, Jul. 1978, pp. 436-447.

Extended Search Report for Counterpart European Patent Application No. 16189005.8, dated Feb. 14, 2017, 12 pages.

* cited by examiner

LOW-POWER CONVERSION BETWEEN ANALOG AND DIGITAL SIGNALS USING ADJUSTABLE FEEDBACK FILTER

CROSS-REFERENCE TO RELATED APPLICATIONS

This non-provisional application is a continuation of U.S. application Ser. No. 15/191,290 filed Jun. 23, 2016 by Alexander Heubi, which claims priority to provisional U.S. Application No. 62/219,532, which was filed on Sep. 16, 2015, each of which is incorporated herein by reference.

BACKGROUND

Various wireless auditory devices, such as hearing aids, contain analog-to-digital and digital-to-analog converters to assist in the digital processing of analog audio signals. Specifically, the analog-to-digital converter (ADC) is used to convert an analog audio signal (captured via a microphone) to a digital signal for processing. The digital-to-analog converter (DAC) is subsequently used to convert the processed digital signal to analog form for output to the eardrum.

Converter designs typically aim to achieve a wide dynamic range so that it is the microphone, and not the converter, that causes the majority of audio noise. Low power consumption is also desirable, since auditory devices are usually small and thus cannot house bulky power sources. Further, the designs attempt to minimize the number and size of off-chip components, since such off-chip components occupy valuable space in the auditory device. Currently, no auditory device achieves a satisfactory nexus of these considerations.

SUMMARY

At least some of the embodiments disclosed herein are directed to a system to convert between analog and digital signals, comprising: a differentiator to produce a differentiated signal based on an input signal and a feedback signal; an integrator, coupled to the differentiator, to integrate the differentiated signal; a quantizer, coupled to the integrator, to quantize the integrated signal; and a low-pass feedback filter, coupled between an output of the quantizer and an input of the differentiator, to generate said feedback signal using the quantized signal, wherein the low-pass feedback filter pushes at least some noise of the quantized signal downward in the frequency spectrum. One or more of these embodiments may be supplemented using one or more of the following concepts, in any order and in any combination: wherein the integrator and the low-pass feedback filter perform a second-order noise shaping on a signal as the signal passes through said system; further comprising digital filtering circuitry, coupled to the quantizer, that includes a low-pass filter to push at least some noise of the quantized signal downward in the frequency spectrum, and that further includes a high-pass filter to attenuate said at least some noise; further comprising digital filtering circuitry, coupled to the quantizer, that includes a low-pass filter that implements the transfer function of said low-pass feedback filter; further comprising digital filtering circuitry, coupled to the quantizer, that includes a decimator to decimate a digital signal; wherein the low-pass feedback filter has a dynamically adjustable cutoff frequency; wherein said dynamically adjustable cutoff frequency is adjusted based at least in part on an amplitude of the input signal; wherein the dynamically adjustable cutoff frequency is less or equal to 20 Hz when the analog input signal amplitude is below a predetermined threshold; wherein the dynamically adjustable cutoff frequency is a function of a clock frequency provided to the system; wherein the low-pass feedback filter comprises multiple capacitors, each of the multiple capacitors capable of being coupled or uncoupled from a voltage supply based on the states of at least a first group of switches, and the multiple capacitors capable of being coupled in multiple serial configurations based on the states of at least a second group of switches; wherein the low-pass feedback filter applies a signal gain that is a function of the number of said multiple capacitors; wherein the roll-off region for the low-pass feedback filter corresponds to a frequency range of 100 Hz to 20 Hz, inclusive; wherein the differentiator and integrator are implemented with a single operational transconductance amplifier (OTA); wherein the integrator is a time-continuous integrator; wherein the system comprises an analog-to-digital converter or a digital-to-analog converter.

At least some embodiments are directed to a method for converting between analog and digital signals, comprising: combining an input signal and a feedback signal to produce a differentiated signal; integrating the differentiated signal to produce an integrated signal; quantizing the integrated signal to produce a quantized signal; and low-pass filtering the quantized signal to produce said feedback signal, said filtering pushes noise in the quantized signal downward in the frequency spectrum. One or more of these embodiments may be supplemented using one or more of the following concepts, in any order and in any combination: further comprising: low-pass filtering the quantized signal to produce a filtered signal having noise pushed downward in the frequency spectrum; and high-pass filtering the filtered signal to attenuate said noise; further comprising dynamically adjusting a cutoff frequency used in said low-pass filtering of the quantized signal; wherein dynamically adjusting the cutoff frequency comprises using an amplitude of the input signal; wherein said low-pass filtering comprises using a low-pass feedback filter having a roll-off region corresponding to a frequency range of 100 Hz to 20 Hz, inclusive.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

Disclosed herein are various embodiments of a delta-sigma analog-to-digital converter (ADC) with the ability to track a wide dynamic range of input signals while maintaining low noise levels, low power consumption, and minimal space requirements. These embodiments generally include a low-pass filter positioned in a feedback loop between the ADC quantizer output and the ADC differentiator input. This low-pass feedback filter is a switched-capacitor circuit that, in tandem with the ADC integrator, implements a second-order noise shaping function. For low-amplitude input signals, the low-pass feedback filter pushes noise in the quantized signal downward in the frequency spectrum to lower, non-audible frequencies (e.g., below 20 Hz), and this noise is subsequently attenuated by a high-pass filter in the digital filtering portion of the ADC. For higher-amplitude, high-frequency input signals, the cut-off frequency of the low-pass feedback filter is increased to maintain the ADC's ability to track the input signal and to avoid integrator saturation while minimizing input referred noise levels. The high-amplitude signal masks the increase in noise that may result from an upward adjustment of cutoff frequency. Such filtering techniques, which are described in greater detail below, substantially reduce power consumption relative to other converters.

The cutoff frequency of the low-pass feedback filter is adjustable by a feedback control logic which, for instance, dynamically adjusts a clock signal frequency to alter the cutoff frequency. Adjusting the clock frequency in this manner modifies the cutoff frequency because the cutoff frequency is a function of the clock frequency. Alternatively, the cutoff frequency of the low-pass feedback filter may be adjusted by increasing the number of serially-coupled capacitors in the filter, as described in greater detail below. In this manner, the audible bandwidth—typically, 100 Hz to 20 kHz—corresponds to the roll-off region of the low-pass feedback filter for low-amplitude signals. The digital filtering portion of the ADC includes a low-pass filter that implements the transfer function of the low-pass feedback filter, as well as typical decimation and high-pass filter blocks to attenuate portions of the signal at frequencies outside of the audible bandwidth. These techniques may be adapted for a digital-to-analog converter (DAC) as well.

Figure 1:
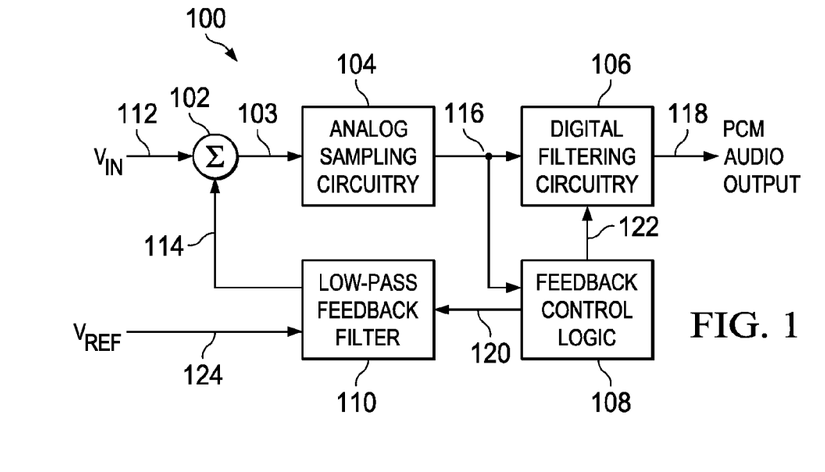
FIG. 1 is a conceptual block diagram of an illustrative analog-to-digital converter (ADC).

FIG. 1 is a conceptual block diagram of an illustrative ADC 100. The ADC 100 comprises a differentiator 102; analog sampling circuitry 104; digital filtering circuitry 106; feedback control logic 108; and a low-pass feedback filter 110. Specific examples of the analog sampling circuitry 104 are provided below, but, in general, the analog sampling circuitry 104 includes any suitable circuitry that is able to receive an analog input signal and to sample and quantize the input signal, preferably to produce an over-sampled, quantized stream as is common among sigma-delta ADCs. Likewise, specific examples of the digital filtering circuitry 106 are provided below, but, in general, the digital filtering circuitry 106 includes any suitable circuitry that is able to mimic the transfer function implemented by the low-pass feedback filter 110 and that decimates and high-pass filters the signal to remove noise that has been pushed down to lower frequencies by other components of the digital filtering circuitry 106 and/or the ADC 100. The feedback control logic 108 includes any suitable logic, such as—and without limitation—a microprocessor or a part of a microprocessor, that can control one or more aspects of the digital filtering circuitry 106 and/or the low-pass feedback filter 110. For instance, an illustrative feedback control logic 108 may adjust the cutoff frequencies of the low-pass feedback filter 110 and/or one or more components of the digital filtering circuitry 106 based on input signal amplitudes and frequencies. Similarly, the feedback control logic 108 may control one or more switches (e.g., field effect transistors (FETs)) implemented in the low-pass feedback filter 110 and/or any of the components of the digital filtering circuitry 106. The feedback control logic 108 may perform some or all of the foregoing actions by, e.g., executing software and/or firmware stored within the feedback control logic 108.

In addition to the components described above, the illustration in FIG. 1 provides numerals to denote several nodes in the ADC 100, which are useful in describing the functions of the ADC below. The ADC 100 includes a node 112 at which an input signal $V_{IN}$ is provided to the differentiator 102. The differentiator 102 also receives a feedback signal from the low-pass feedback filter 110 via node 114. Node 103 provides the output of the differentiator 102 to the analog sampling circuitry 104. Further, the output of the analog sampling circuitry 104 is provided at node 116, and this output signal is provided to the digital filtering circuitry 106 and to the feedback control logic 108. The feedback control logic 108, in turn, outputs its control signals at nodes 120 and 122. The low-pass feedback filter 110 receives a reference signal $V_{REF}$ at node 124 and the control signal from the feedback control logic 108 at node 120 to produce the feedback signal at node 114. The ADC 100 produces a pulse-coded modulation (PCM) output signal at node 118.

As mentioned, the low-pass feedback filter 110 has a dynamically adjustable cutoff frequency. This cutoff frequency may be controlled by the feedback control logic 108 based on the input signal amplitudes and frequencies. In some embodiments, for instance, the feedback control logic 108 contains code that is programmed to cause the feedback control logic 108 to recognize when the input signal amplitude and/or frequency meets predetermined criteria. When such criteria are met, indicating, e.g., a low-amplitude signal, the feedback control logic 108 causes the cutoff frequency of the low-pass feedback filter 110 to be pushed downward in the frequency spectrum. The signal noise is likewise pushed downward in the frequency spectrum for subsequent attenuation by a high-pass filter in, e.g., the digital filtering circuitry 106. Similarly, when the feedback control logic 108 determines that other predetermined criteria are met, indicating, e.g., a high-amplitude, high-frequency signal, the feedback control logic 108 causes the cutoff frequency of the low-pass feedback filter 110 to move upward in the frequency spectrum. This upward shift in cutoff frequency results in additional noise, but the additional noise is masked by the increased signal amplitude. This adjustment of the cutoff frequency facilitates tracking of the input signal through a considerably wide dynamic range.

Figure 2:
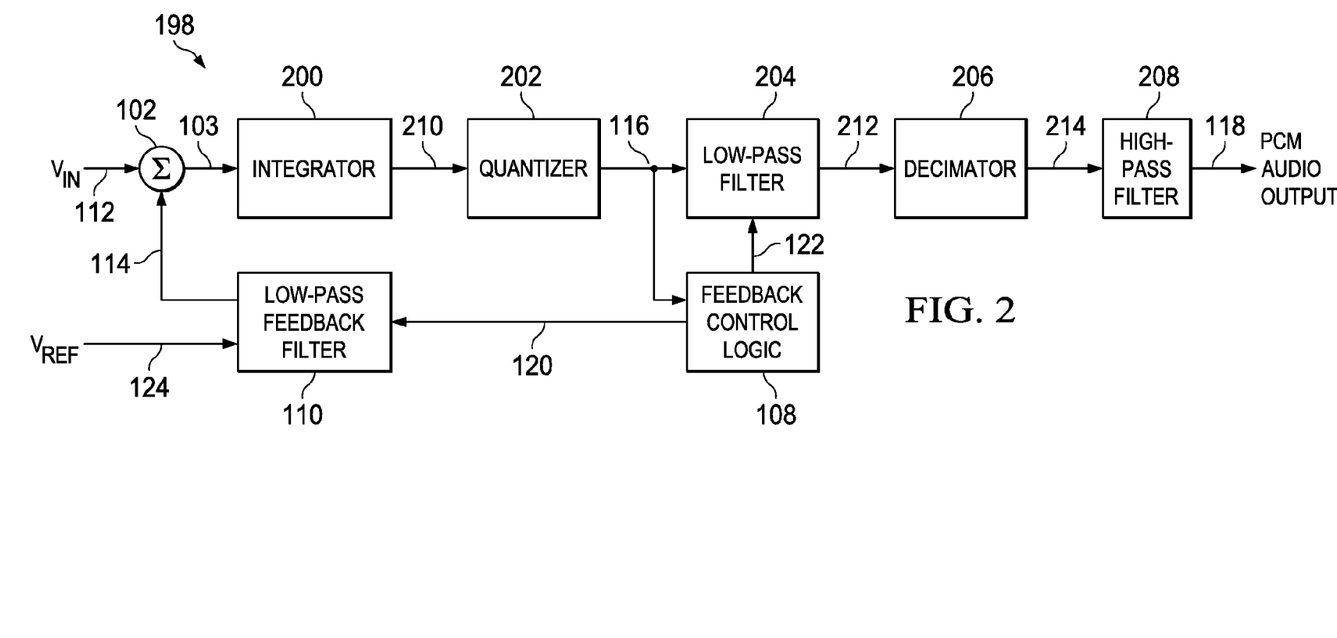
FIG. 2 is a detailed block diagram of an illustrative ADC.

FIG. 2 is a detailed block diagram of an illustrative ADC 198. The ADC 198 represents a subset of embodiments of the ADC 100 of FIG. 1, but it does not limit the scope of this disclosure. The ADC 198 contains the differentiator 102; feedback control logic 108; low-pass feedback filter 110; and nodes 112, 114, 103, 116, 118, 120, 122 and 124, all of which are described above with respect to the ADC 100 of FIG. 1. The ADC 198 additionally comprises an integrator 200 (e.g., preferably a first-order integrator to achieve a desired dynamic range approaching 100 dB, although any order integrator may be used to attenuate quantization noise)

and quantizer 202, which together form part or all of the analog sampling circuitry 104 of FIG. 1. The integrator 200 receives the output signal of the differentiator 102 via node 103, and, in turn, it outputs an integrated signal on node 210. The signal on node 210 is provided to the quantizer 202, which quantizes the signal and outputs an over-sampled, quantized signal on node 116. The ADC 198 also comprises a low-pass filter 204, decimator 206 and high-pass filter 208, which collectively form some or all of the digital filtering circuitry 106 shown in FIG. 1. The low-pass filter 204 receives the over-sampled, quantized signal from the quantizer 202 via node 116, implements the transfer function of the low-pass feedback filter 110 by pushing noise in the signal downward in the frequency spectrum (e.g., using a 20 Hz cutoff frequency for low-amplitude signals, such as those below −35 dBV; a higher cutoff frequency is used for higher-amplitude signals with higher frequencies), and provides a filtered signal on node 212. Although the higher cutoff frequency allows additional noise, the high-amplitude nature of the signal masks the additional noise.

Figure 3:
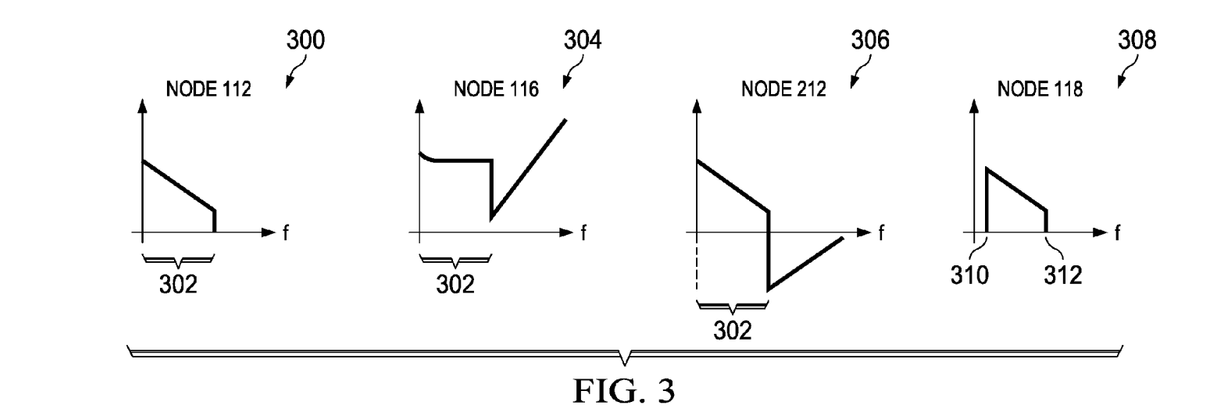
FIG. 3 is a set of frequency domain graphs showing signal frequency spectra at various nodes in the ADC of FIG. 2.
Figure 4:
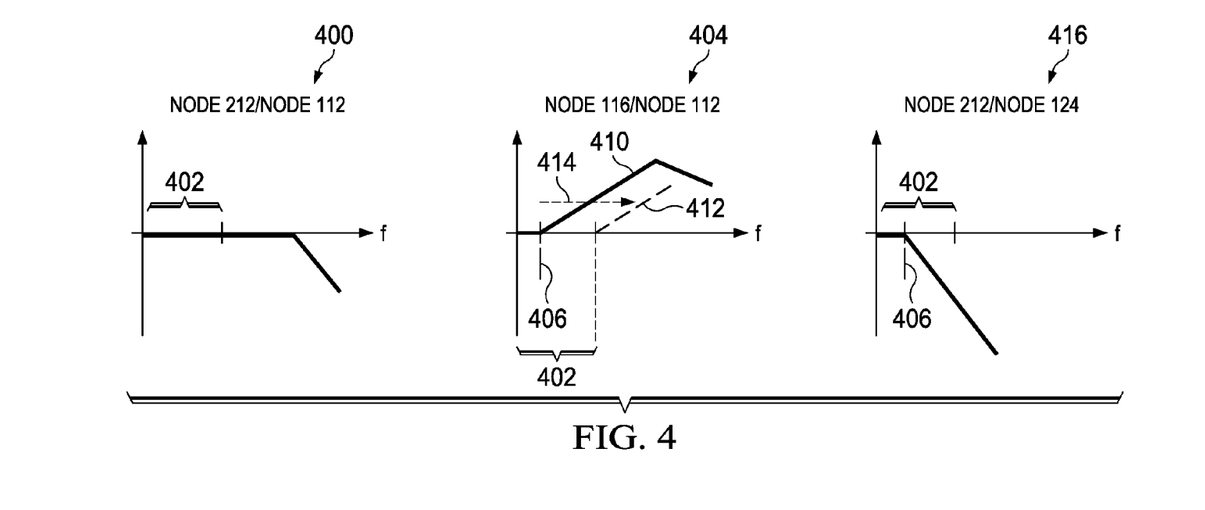
FIG. 4 is a set of graphs showing transfer functions between various nodes in the ADC of FIG. 2.

The filtered signal on node 212 is decimated by the decimator 206 according to any suitable decimation scheme and is provided on node 214. The high-pass filter (e.g., DC removal circuit) 208 receives the signal on node 214 as an input and filters the signal to attenuate the noisy portions of the signal. The PCM audio output is provided on node 118. FIGS. 3 and 4, each of which provides multiple frequency spectra graphs to demonstrate the functions of the ADCs 100 and 198, are now described, followed by a more detailed description of the ADC 198 with respect to FIG. 5.

FIG. 3 depicts a set of graphs 300, 304, 306 and 308 showing signal frequency spectra at various nodes in the ADC 198 of FIG. 2. Each of these graphs is in the frequency domain and thus plots frequency on the x-axis and signal amplitude on the y-axis. In graph 300, the frequency spectrum for node 112 is shown with an illustrative −20 dB/decade steepness in an audio band 302. Graph 304 shows the frequency spectrum at the output node 116 of the quantizer 202. As shown, the signal amplitude is flat in the portion of the audio band 302 above the low-pass filter cutoff frequency, and the amplitude rises sharply in frequencies above the audio band 302 due to quantization noise. The curved area at the lowest frequencies represents low-frequency noise added by prior low-pass filtering, and it is subsequently removed by the high-pass filter 208. Graph 306 shows the frequency spectrum at node 212 demonstrating attenuation due to the low-pass filter 204. The attenuation increases in intensity with increasing frequency. Noise has been pushed to the low end of the frequency range (e.g., below 20 Hz). Graph 308 depicts the results of decimation and high-pass filtering on the spectrum at node 118, where the highest and lowest frequency contents are significantly attenuated, as arrows 310 and 312 demonstrate. The high-pass filter 208 attenuates the low-frequency contents of the signal, and the decimator 206 includes a low-pass filter to attenuate the high-frequency contents of the signal. The cutoff frequencies for each may be chosen as desired and as may be suitable.

FIG. 4 is a set of graphs 400, 404, and 416 showing transfer functions between various nodes in the ADC 198 of FIG. 2 in the frequency domain. The graph 400 depicts the transfer function for node 212 in relation to node 112. The transfer function is flat above the audio band 402 and rolls off at a higher frequency. Graph 404 depicts the transfer function for node 116 in relation to node 112. It shows, e.g., a +20 dB per decade slope (numeral 410) above the low-pass feedback filter cutoff frequency (numeral 406), meaning that the maximum input signal amplitude decreases with frequency due to the low-pass behavior of the feedback filter. As shown, the low-pass feedback filter cutoff frequency 406 must be adjusted upward (numerals 412 and 414) to handle high-amplitude, high-frequency input signals. Graph 416 depicts the transfer function for node 212 in relation to node 124. This transfer function demonstrates that the reference signal $V_{REF}$ is attenuated in the portion of the audio band 402 above the low-pass feedback filter cutoff frequency 406, thus improving noise levels.

Figure 5:
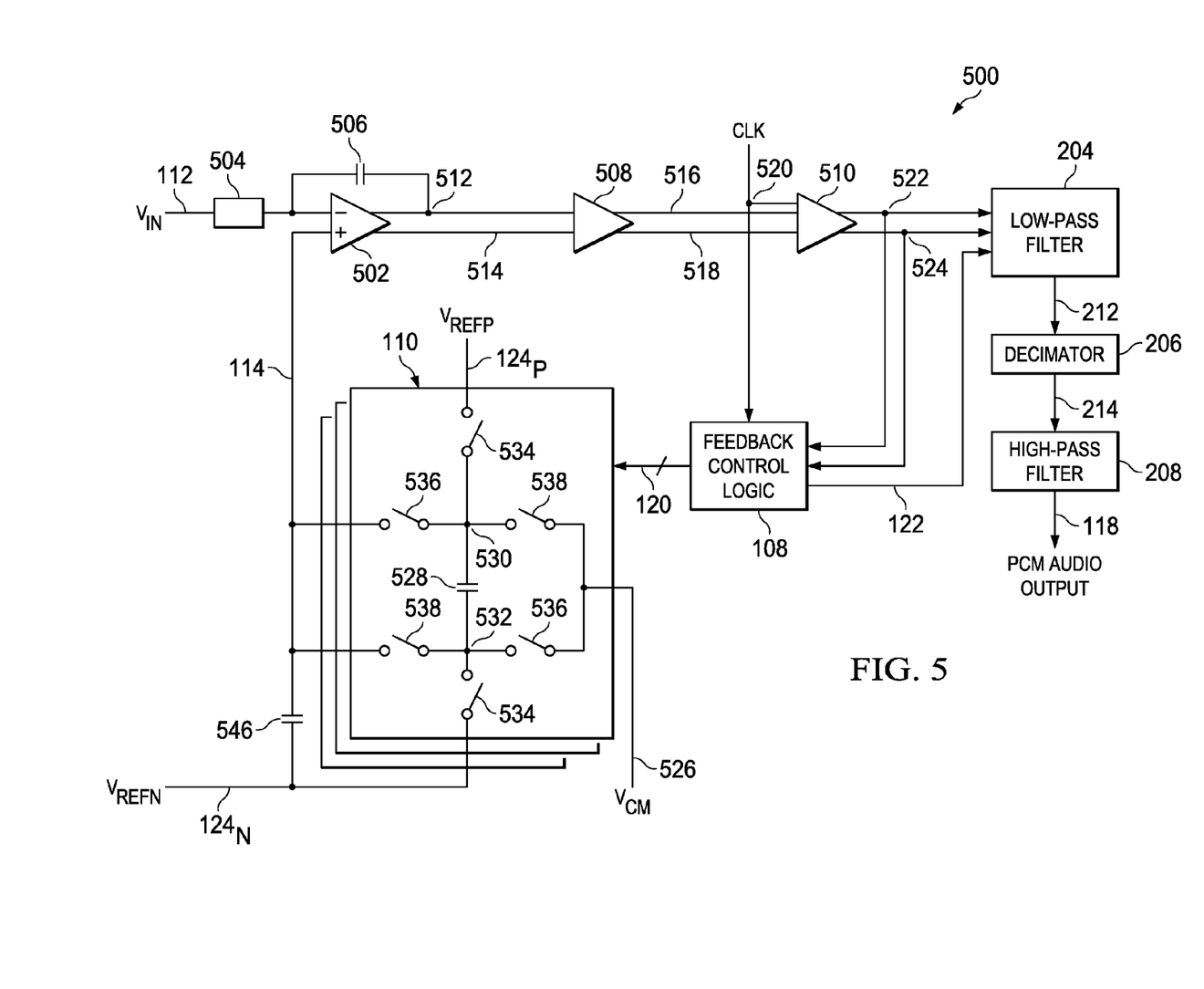
FIG. 5 is a circuit schematic diagram of an illustrative ADC.

FIG. 5 is a circuit schematic diagram of an illustrative ADC 500. The ADC 500 is an embodiment of the ADCs 100 and 198 of FIGS. 1 and 2, but it is illustrative and does not limit the scope of this disclosure. The ADC 500 comprises an operational transconductance amplifier (OTA) 502. An impedance 504 couples to the inverting input of the OTA 502, as does a feedback loop comprising a capacitor 506. An illustrative value for the impedance 504 (e.g., resistor) is 10 kilo Ohms and an illustrative value for the capacitor 506 is 30 pico Farads, bearing in mind that an increase in overall area results in a decrease in noise and vice versa. The non-inverting input of the OTA 502 couples to node 114, which is the output of the low-pass feedback filter 110. The single OTA 502, together with the impedance 504 and capacitor 506, performs the functions of the differentiator 102 and integrator 200 shown in FIG. 2. In general, the integrator 200 is a first-order, high-input-impedance, time-continuous integrator that provides a low-pass filtering functionality to avoid aliasing of the input signal. The OTA 502 provides two outputs at nodes 512 and 514, each of which is input to a simple gain stage 508 (e.g., 30 dB, although in alternative embodiments, the gain stage 508 is removed completely), which produces outputs at nodes 516 and 518. The signals on nodes 516 and 518 are provided to a clocked comparator 510, which also receives a clock signal CLK 520 (e.g., 3-5 MHz, bearing in mind that the clock frequency should be as close to the RC time constant of the impedance 504 and capacitor 506 as possible), as shown. The gain stage 508 and the clocked comparator 510 together form the quantizer 202 of FIG. 2.

The clocked comparator 510 outputs the result of its comparison to nodes 522 and 524. The nodes 522 and 524 are coupled to the low-pass filter 204 and to feedback control logic 108. The feedback control logic 108 also receives the clock signal CLK 520. The feedback control logic 108 controls the cutoff frequencies for the low-pass filter 204 (via node 122) and for the low-pass feedback filter 110 (via node 120). In some embodiments, the feedback control logic 108 exerts cutoff frequency control over these two low-pass filters by regulating the clock signal frequency, since the cutoff frequencies are a function of clock signal frequency. Alternatively or in addition, a plurality of capacitors 528 in filters 110 may be coupled in parallel using independently controllable switches 536 and/or 538, so that the feedback control logic 108 can dynamically open and close the switches to adjust the total capacitance present between nodes 526 and 114. In some embodiments, for relatively low amplitude signals, only one capacitor 528 may be active, and the switches associated with the remaining capacitors may be open. In some embodiments, for relatively high amplitude signals, multiple capacitors 528 may be active by switching them in parallel.

As explained previously, the low-pass filter 204 implements the transfer function of the low-pass feedback filter 110; thus, in at least some embodiments, the cutoff frequencies are the same in both of these filters. The feedback control logic 108 also controls the switching action of the low-pass feedback filter 110 using switching control signals provided via node 120. The feedback control logic 108 performs some or all of its actions using, for instance, a microprocessor or part of a microprocessor that executes suitably-programmed code stored on a computer-readable medium.

Still referring to FIG. 5, the low-pass feedback filter 110 includes one or more capacitors 528 (e.g., 32 femto Farads); one or more switches 534; one or more switches 536; and one or more switches 538. The feedback filter 110 further comprises a node 530 and a node 532. The switches 534 couple the nodes 530 and 532 to $V_{REFP}$ (e.g., below 2 Volts) and $V_{REFN}$ (e.g., below 2 Volts) at nodes $124_P$ and $124_N$, respectively. The switches 536 couple the capacitor 528 to nodes 114 and 526 with one polarity, while the switches 538 couple the capacitor 528 to the nodes 114 and 526 with the opposite polarity. Typically, switches 536 are closed when switches 538 are open and vice versa. The voltage $V_{CM}$ at node 526 is the common mode (i.e., midpoint) voltage of the ADC 500 and may be selected as desired (e.g., below 2 Volts). The switches 534, 536 and 538 are controlled by the feedback control logic 108. The low-pass feedback filter 110 may contain any number of the capacitor(s) 528 in series, preferably in multiples of four. The capacitors 528 also may be coupled in parallel, as described above. The node 114 couples to a capacitor 546 (e.g., 100-200 pico Farads) that also couples to the node $124_N$.

In operation, the low-pass feedback filter 110 is used to manipulate the charge on the capacitor 546, which is increased or decreased to track the input signal. Specifically, the filter 110 operates in two phases. In the first phase, the switches 534 are closed, and all other switches are open. The capacitor(s) 528 are charged to $V_{REF}$, which is the potential between $V_{REFP}$ and $V_{REFN}$ at nodes $124_P$ and $124_N$. In the second phase, depending on the output of the quantizer (i.e., the clocked comparator 510), the charge on the capacitor 546 is increased or decreased to track the input signal. To increase the charge on the capacitor 546, the switches 536 are closed and the switches 538 are opened; conversely, to decrease the charge on the capacitor 546, the switches 536 are opened and the switches 538 are closed. Increasing and decreasing the charge on capacitor 546 in this manner alters the signal provided to the non-inverting input of OTA 502 via node 114.

Still referring to FIG. 5, the low-pass filter 204 implements the transfer function of the low-pass feedback filter 110. This may be accomplished in any suitable manner. For instance, in some embodiments, the low-pass feedback filter 110 may be replicated in the low-pass filter 204. In other embodiments, a simple low-pass filter that implements the transfer function of the filter 110 may be employed. In still other embodiments, any circuitry that functions to implement the transfer function of the filter 110 may be used. Any and all suitable techniques for implementing the low-pass filter 204 are contemplated and included within the scope of this disclosure. Regardless of the specific manner in which the low-pass filter 204 is implemented, the filter 204 has a dynamically adjustable cutoff frequency that is controlled by the feedback control logic 108 via node 122. Decimators are well-known in the art and, therefore, the decimator 206 is not described in detail here. The high-pass filter 208 may be a simple high-pass filter that attenuates signals below the audio bandwidth of interest (e.g., with an illustrative cutoff frequency of 20 Hz to 100 Hz). The PCT audio signal is output at node 118.

Figure 6:
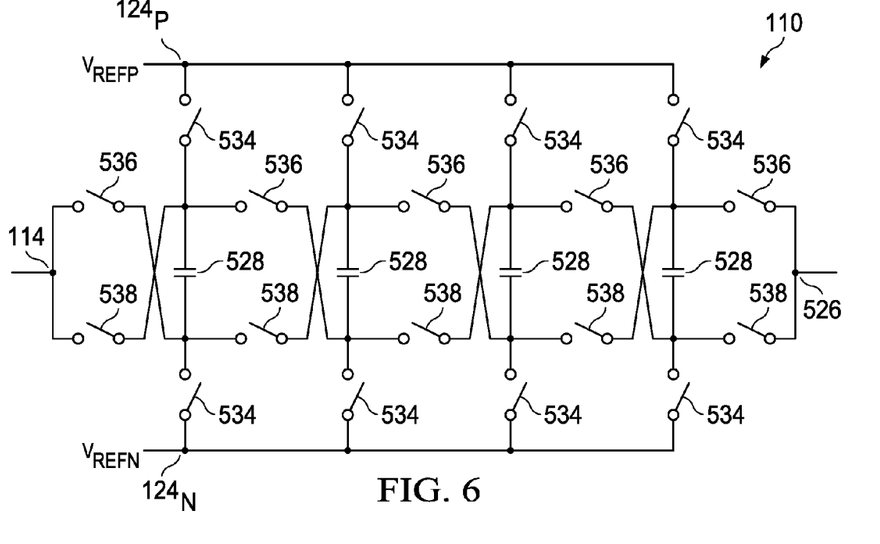
FIG. 6 is a circuit schematic diagram of an illustrative low-pass feedback filter in an illustrative ADC.

The cutoff frequency of the filter 110 is determined as follows:

$$f_{cutoff} = \frac{f_{clk} * C_{528}}{2 * \pi * C_{546}} \quad (1)$$

where $f_{cutoff}$ is the cutoff frequency of the filter 100, $C_{528}$ is the capacitance of the capacitor 528, and $C_{546}$ is the capacitance of the capacitor 546. Although FIG. 5 shows only one capacitor 528, in some embodiments, multiple such capacitors 528 may be coupled in series to adjust the cutoff frequency of the filter 110. Because any such capacitors 528 are coupled in series, each additional capacitor 528 reduces the total capacitance of the filter 110. This reduction in total capacitance results in a decrease in the cutoff frequency (see equation (1)). (The cutoff frequency may also be adjusted by adjusting clock frequency or by coupling multiple capacitors 528 in parallel as described above.) FIG. 6 depicts such a serial assembly of capacitors 528, the quantity of which adjusts the cutoff frequency upward or downward. Specifically, FIG. 6 is a circuit schematic diagram of an illustrative low-pass feedback filter 110 in an illustrative ADC. The filter 110 comprises four capacitors 528 and multiple switches 534, 536 and 538 coupled in the arrangement shown. Although the filter 110 of FIG. 6 depicts four capacitors 528, any number of such capacitors may be used, preferably in multiples of four for an optimal combination of complexity, effectiveness and power consumption. The switches 534 couple the capacitors 528 to $V_{REFP}$ and $V_{REFN}$. When the switches 536 are closed and switches 538 are open, the capacitors 528 are coupled in series in one polarity. When the switches 538 are closed and switches 536 are open, the capacitors 528 are coupled in series in the opposite polarity. The effect of these opposing polarities, as explained above, is to charge or drain the capacitor 546 to track the input signal. The filter 110 applies a signal gain that is a function of the number of capacitors 528 coupled in series.

Figure 7:
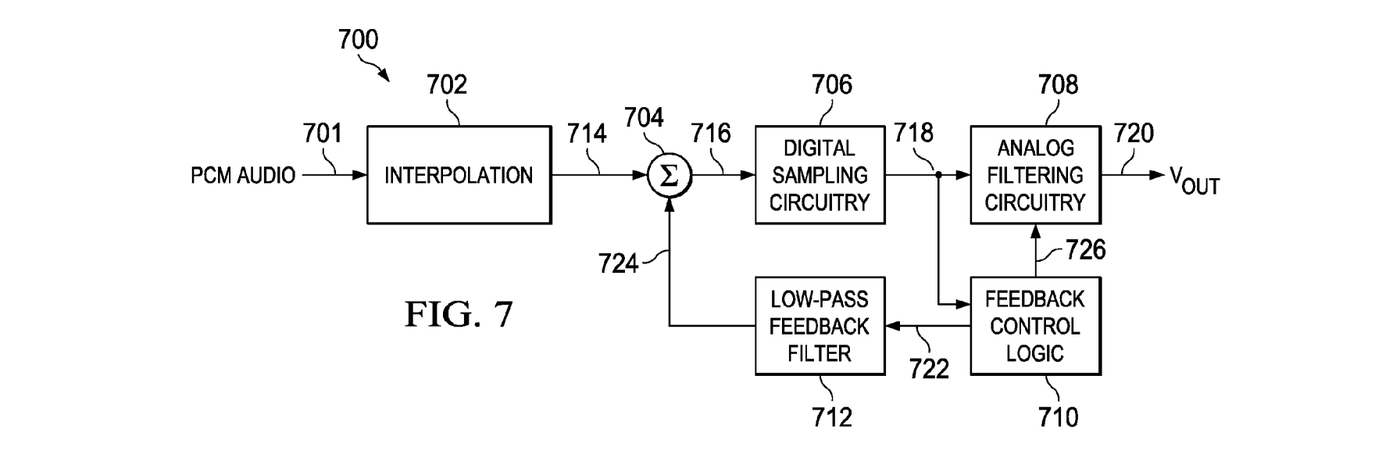
FIG. 7 is a conceptual block diagram of an illustrative digital-to-analog converter (DAC).

The concepts described above in relation to ADCs may also be implemented in digital-to-analog converters (DACs). FIG. 7 is a conceptual block diagram of an illustrative DAC 700. The DAC 700 comprises an interpolation logic 702; a differentiator 704; digital sampling circuitry 706; analog filtering circuitry 708; feedback control logic 710; and low-pass feedback filter 712. The interpolation logic 702 receives a PCM audio signal on node 701 and produces an over-sampled, interpolated output signal at node 714. The differentiator 704 receives the interpolated output signal and the feedback signal via node 724 to produce a differentiated signal on node 716. The differentiated signal is provided to the digital sampling circuitry 706. Specific examples of the digital sampling circuitry 706 are provided below, but, in general, the digital sampling circuitry 706 includes any suitable circuitry that is able to receive a digital input signal and to sample and quantize the input signal. The output of the digital sampling circuitry 706 is provided on node 718. The signal on node 718 is input to the analog filtering circuitry 708 and to the feedback control logic 710. Specific examples of the analog filtering circuitry 708 are provided below, but, in general, the analog filtering circuitry 708 includes any suitable circuitry that is able to filter and buffer the signal to produce an analog signal $V_{OUT}$ at node 720.

The feedback control logic 710 includes any suitable logic, such as—and without limitation—a microprocessor or a part of a microprocessor (as well as software and/or firmware stored on a computer-readable medium) that can control one or more components of the analog filtering circuitry 708 and/or the low-pass feedback filter 712. For instance, an illustrative feedback control logic 710 may adjust the cutoff frequencies of the low-pass feedback filter 712 and/or one or more components of the analog filtering circuitry 708. Similarly, the feedback control logic 710 may control one or more switches (e.g., field effect transistors (FETs)) implemented in the low-pass feedback filter 712 and/or any of the components of the analog filtering circuitry 708. The feedback control logic provides its control signals to the analog filtering circuitry 708 via node 726 and to the low-pass feedback filter 712 via the node 722. The feedback control logic 710 uses these signals to adjust the cutoff frequencies of these filters based on the input signal amplitude and frequency. As with the feedback control logic 108 of FIGS. 1 and 2, the feedback control logic 710 may be programmed to adjust cutoff frequencies of various filters in the DAC 700 based on any suitable criteria.

Figure 8:
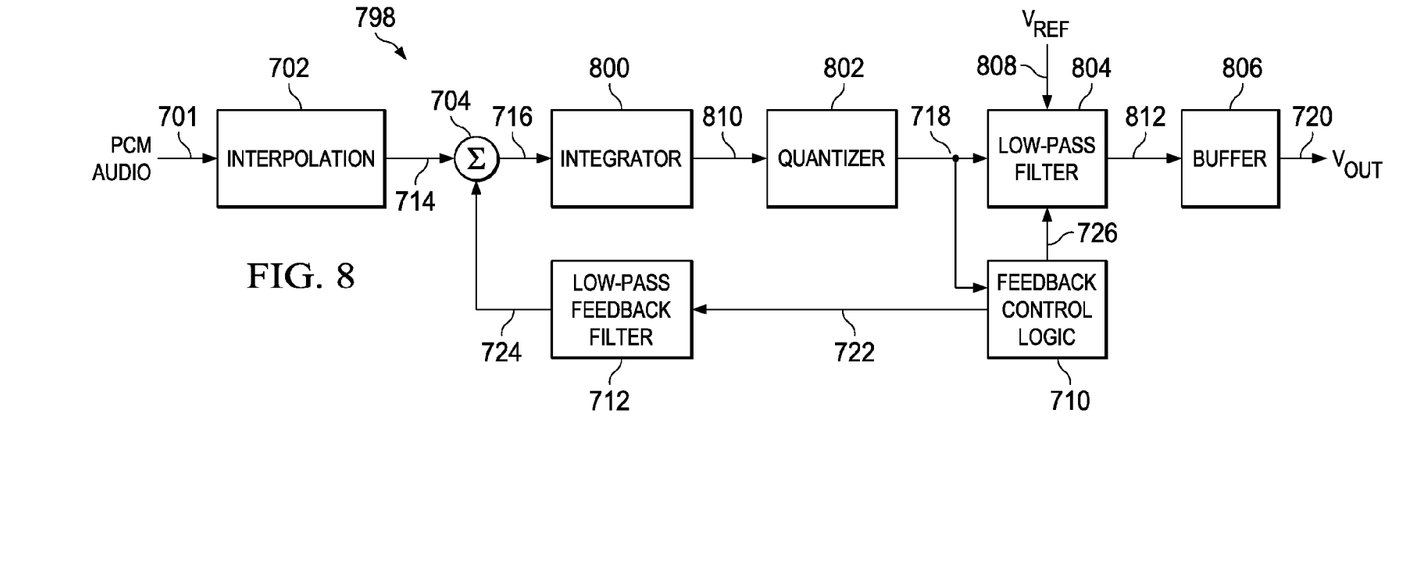
FIG. 8 is a detailed block diagram of an illustrative DAC.

FIG. 8 is a detailed block diagram of an illustrative DAC 798. The DAC 798 is an embodiment of the DAC 700 of FIG. 7, but it is merely illustrative and does not limit the scope of this disclosure. As shown, the DAC 798 contains many of the same components as the DAC 700, but it additionally provides specific components for the digital sampling circuitry 706 and the analog filtering circuitry 708. Specifically, the DAC 798 comprises an integrator 800 having an output signal on a node 810 that is provided to the quantizer 802. These components form part or all of the digital sampling circuitry 706 of FIG. 7. The functions of integrators and quantizers have already been described herein and thus are not repeated here. The DAC 798 further comprises a low-pass filter 804 and a buffer (or simple low-pass filter) 806. These components form part or all of the analog filtering circuitry 708 of FIG. 7. The low-pass filter 804, which receives a $V_{REF}$ signal via node 808, is in some embodiments identical or similar to the feedback filter circuitry depicted in FIGS. 5 and 6. The low-pass feedback filter 712 may be similarly implemented. The scope of disclosure, however, is not limited to the circuitry of FIGS. 5 and 6, and other variations and implementations are encompassed within the scope of this disclosure. The output of the low-pass filter 804 is provided to the buffer 806 via node 812. The buffer 806 (or, in some embodiments, a simple low-pass filter) may be used alone or in combination with other appropriate filters to limit the bandwidth of the output signal.

Figure 9:
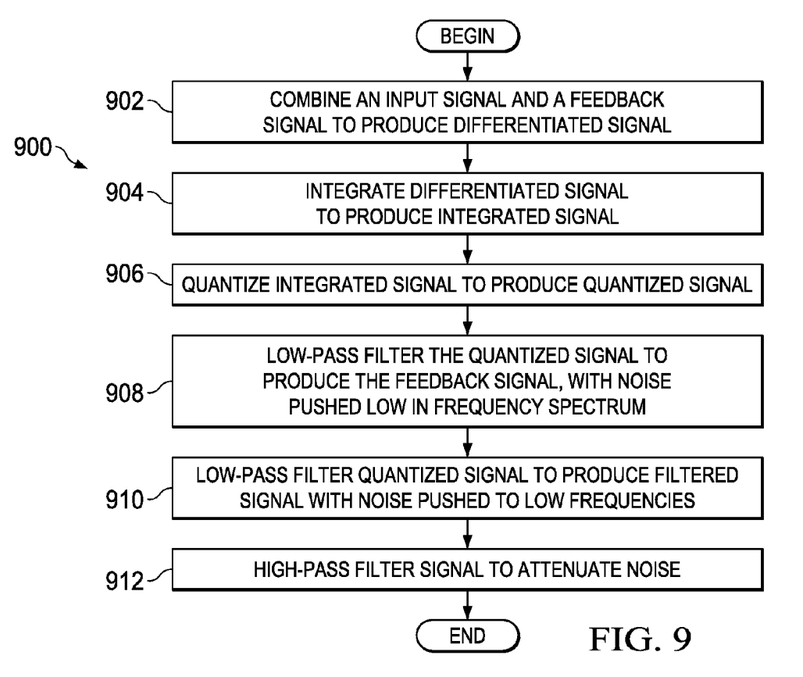
FIG. 9 is a flow diagram of an illustrative method performed by an ADC.

FIG. 9 is a flow diagram of an illustrative method 900 performed by an ADC. The method 900 begins with a differentiator combining an analog input signal and a feedback signal to produce a differentiated signal (step 902). The method 900 continues with an integrator integrating the differentiated signal to produce a time-continuous integrated signal (step 904). The method 900 next includes quantizing the integrated signal to produce an over-sampled, quantized signal (step 906). Additionally, the quantized signal is passed through a low-pass feedback filter to produce the feedback signal, with noise pushed low in the frequency spectrum for low-amplitude input signals (step 908). The method 900 further comprises using low-pass and high-pass filters in a digital portion of the ADC to shape and attenuate noise as desired (steps 910 and 912), thus producing a digitized output signal. The method 900 may be adjusted as desired—for instance, by adding, deleting, modifying and/or re-arranging one or more steps.

Numerous other variations and modifications will become apparent to those skilled in the art once the above disclosure is fully appreciated. It is intended that the following claims be interpreted to embrace all such variations, modifications and equivalents. In addition, the term "or" should be interpreted in an inclusive sense.

The following is claimed:

1. A system to convert between analog and digital signals, comprising:
a differentiator configured to produce a differentiated signal based on an input signal and a feedback signal;
an integrator, coupled to the differentiator and configured to integrate the differentiated signal to generate an integrated signal;
a quantizer, coupled to the integrator and configured to quantize the integrated signal to generate a quantized signal;
a feedback control logic circuit coupled to an output of the quantizer; and
a low-pass feedback filter, coupled between the feedback control logic circuit and an input of the differentiator and configured to generate the feedback signal based on the quantized signal,
wherein the low-pass feedback filter has a dynamically adjustable cutoff frequency that is adjustable during normal operations of the system to filter at least some noise of the quantized signal based on an amplitude of the input signal and a frequency of the quantized signal.

2. The system of claim 1, wherein the integrator and the low-pass feedback filter are configured to perform a second-order noise shaping on a signal as the signal passes through the system.

3. The system of claim 1, further comprising digital filtering circuitry, coupled to the quantizer and the feedback control logic, that includes a low-pass filter configured to push at least some noise of the quantized signal downward in a frequency spectrum, and that further includes a high-pass filter configured to attenuate the at least some noise.

4. The system of claim 1, further comprising digital filtering circuitry, coupled to the quantizer and the feedback control logic, that includes a low-pass filter that is configured to implement a filtering transfer function of the low-pass feedback filter.

5. The system of claim 1, further comprising digital filtering circuitry, coupled to the quantizer, that includes a decimator configured to decimate a digital signal.

6. The system of claim 1, further comprising digital filtering circuitry, coupled to the quantizer and the feedback control logic, that includes a low-pass filter that is configured to implement a filtering transfer function of the low-pass feedback filter, a high-pass filter configured to attenuate the at least some noise, and a decimator configured to decimate a digital signal.

7. The system of claim 1, wherein the feedback control logic circuit is configured to receive a clock signal of the system for use in controlling the dynamically adjustable cutoff frequency of the low-pass feedback filter.

8. The system of claim 1, wherein the dynamically adjustable cutoff frequency is less than or equal to 20 hertz (Hz) when the amplitude of the input signal is below a predetermined threshold.

9. The system of claim 1, wherein the dynamically adjustable cutoff frequency is adjusted based at least in part on a clock signal received by the system.

10. The system of claim 1, wherein the low-pass feedback filter is further configured to receive a reference voltage signal, and wherein the low-pass feedback filter is further configured to generate the feedback signal based on the reference voltage signal.

11. The system of claim 1, wherein the feedback control logic is configured to control the low-pass feedback filter via a control signal to generate the feedback signal.

12. The system of claim 11, wherein the low-pass feedback filter is further configured to generate the feedback signal based on the control signal, and wherein the low-pass feedback filter is dynamically controllable to have a first cutoff frequency when the quantized signal has a first amplitude, and wherein the low-pass feedback filter is controllable by the feedback control logic circuit to have a second cutoff frequency higher than the first cutoff frequency when the quantized signal has a second amplitude greater than the first amplitude.

13. An apparatus, comprising:
   an operational transconductance amplifier (OTA) configured to differentiate and integrate an input signal to produce a first differential output signal;
   a clocked comparator coupled to an output of the OTA and configured to receive a clock signal and compare a first component of the first differential output signal and a second component of the first differential output signal to produce a second differential output signal;
   a feedback control logic circuit coupled to the clocked comparator;
   a low-pass filter coupled to the clocked comparator and the feedback control logic and configured to filter the second differential output signal; and
   a low-pass feedback filter coupled to the feedback control logic and a second input of the OTA and configured to generate a feedback signal.

14. The apparatus of claim 13, further comprising:
   an impedance element coupled to a first input of the OTA;
   a first capacitor coupled to the output of the OTA and the first input of the OTA; and
   a second capacitor coupled to an output of the low-pass feedback filter and the second input of the OTA.

15. The apparatus of claim 13, wherein the feedback control logic circuit is configured to:
   receive the clock signal and the second differential output;
   generate a cutoff frequency control signal at least partially based on the clock signal to control a cutoff frequency of the low-pass filter; and
   generate a switching control signal operable to control the low-pass feedback filter to implement a transfer function of the low-pass feedback filter.

16. The apparatus of claim 15, wherein the low-pass filter is operable to implement the transfer function of the low-pass feedback filter by filtering the second differential output signal at least partially based on the cutoff frequency control signal.

17. A method for converting between analog and digital signals, comprising:
   combining an input signal and a feedback signal to produce a differentiated signal;
   integrating the differentiated signal to produce an integrated signal;
   quantizing the integrated signal to produce a quantized signal;
   generating a control signal for controlling a filter based on the quantized signal; and
   low-pass filtering the quantized signal to produce the feedback signal, wherein the low-pass filtering pushes noise in the quantized signal downward in a frequency spectrum based on the control signal, the quantized signal, and a reference voltage.

18. The method of claim 17, further comprising:
   low-pass filtering the quantized signal to produce a filtered signal having the noise pushed downward in the frequency spectrum; and
   high-pass filtering the filtered signal to attenuate the noise.

19. The method of claim 17, further comprising dynamically adjusting a cutoff frequency used in the low-pass filtering of the quantized signal.

20. The method of claim 19, wherein dynamically adjusting the cutoff frequency comprises using an amplitude of the input signal.

* * * * *